(12) United States Patent
Legat et al.

(10) Patent No.: US 8,558,328 B2
(45) Date of Patent: Oct. 15, 2013

(54) SEMICONDUCTOR DEVICE WITH INTEGRATED PIEZOELECTRIC ELEMENTS AND SUPPORT CIRCUITRY

(75) Inventors: Timothy John Legat, McKinney, TX (US); Alexander Noam Teutsch, Murphy, TX (US); Ross Elliot Teggatz, McKinney, TX (US); Thomas Richard Maher, Rehoboth, MA (US)

(73) Assignee: Texas Instruments Incorporated, Dallas, TX (US)

( * ) Notice: Subject to any disclaimer, the term of this patent is extended or adjusted under 35 U.S.C. 154(b) by 67 days.

(21) Appl. No.: 12/786,969

(22) Filed: May 25, 2010

(65) Prior Publication Data

US 2010/0230768 A1 Sep. 16, 2010

Related U.S. Application Data

(62) Division of application No. 11/171,939, filed on Jun. 30, 2005, now Pat. No. 7,723,232.

(51) Int. Cl.
*H01L 29/82* (2006.01)
(52) U.S. Cl.
USPC ............ 257/415; 257/414; 257/416; 257/417
(58) Field of Classification Search
USPC ................................. 257/414, 415, 416, 417
See application file for complete search history.

(56) References Cited

U.S. PATENT DOCUMENTS

| | | | |
|---|---|---|---|
| 4,766,655 A | 8/1988 | Hickox | |
| 5,184,515 A | 2/1993 | Terry et al. | |
| 5,600,074 A | 2/1997 | Marek et al. | |
| 5,856,765 A | 1/1999 | Wada et al. | |
| 5,983,727 A | 11/1999 | Wellman et al. | |
| 6,210,989 B1 | 4/2001 | Kurtz et al. | |
| 6,232,139 B1 | 5/2001 | Casalnuovo et al. | |
| 6,378,996 B1 * | 4/2002 | Shimada et al. | 347/70 |
| 6,401,542 B1 | 6/2002 | Kato | |
| 6,700,174 B1 * | 3/2004 | Miu et al. | 257/419 |
| 2002/0117937 A1 | 8/2002 | Sakata et al. | |
| 2003/0148610 A1 | 8/2003 | Igel et al. | |
| 2005/0104939 A1 | 5/2005 | Wada et al. | |

* cited by examiner

*Primary Examiner* — Samuel Gebremariam
(74) *Attorney, Agent, or Firm* — Warren L. Franz; Wade J. Brady, III; Frederick J. Telecky, Jr.

(57) ABSTRACT

A semiconductor device suitable for use in a pressure sensor is disclosed. A uniformly thin die is provided by chemically etching a back side of a wafer. Piezoelectric elements formed integrally within the die generate electrical signals in response to flexing the die. Conductive leads formed integrally within the die electrically communicate the generated electrical signals to support circuitry formed integrally within the die proximate the piezoelectric elements. In an example embodiment, the piezoresistive elements take the form of silicon resistors formed integrally via doping and diffusion in a Wheatstone bridge configuration. In one application, the die serves as a deformable diaphragm, seated atop an aperture of a threaded pressure sensor housing.

12 Claims, 3 Drawing Sheets

SEMICONDUCTOR DEVICE WITH INTEGRATED PIEZOELECTRIC ELEMENTS AND SUPPORT CIRCUITRY

This application is a division of application Ser. No. 11/171,939, filed Jun. 30, 2005, the entirety of which is incorporated herein by reference.

BACKGROUND

The invention relates generally to semiconductor devices, and more particularly to semiconductor devices having piezoelectric or the like pressure sensing elements.

It can be appreciated that some semiconductor devices comprise elements or features that actually deflect or otherwise move or deform in the operation of the devices. For example, some types of sensors, such as pressure sensors and/or accelerometers/decelerometers, for example, include a portion of a semiconductor substrate (e.g., silicon) that moves in response to changes in pressure and/or acceleration or deceleration, for example. Such devices can be used in automotive applications, for example, to determine the severity of a side impact collision as well as whether an individual is present in a passenger seat of the automobile, and thus whether both a driver side and a passenger side airbag should be deployed, for example. Similarly, such sensors could be used to determine the pressure within different systems of an automobile, such as within the engine, for example, and thus whether a 'check engine' light should be activated or illuminated.

Such devices generally comprise one or more piezoelectric elements whose electrical characteristics change as a function of an encountered force, (e.g., amount of deflection). The devices may employ piezoresistance, for example, such that a resistance changes as a function of deflection (e.g., due to a change in pressure). Such piezoresistive elements can be formed, for example, through diffusion or doping processes whereby the resistance of these treated areas changes as a function of applied stress. It is not uncommon for such devices to be arranged in a Wheatstone bridge configuration to provide an enhanced output signal. In any event, sensing regions generally require associated circuitry, such as support circuitry for calibration and/or compensation, among other things, for example. Signals produced by the piezoresistive elements can, for example, be sensed by conductive traces and then processed by associated circuitry and forwarded via leads to external circuitry, which can, for example, use the sensed signals to determine whether to deploy an airbag.

It can also be appreciated that there is an ongoing desire to decrease the size of semiconductor devices while concurrently reducing the cost of such devices, such as through streamlining an associated fabrication process, for example. Nevertheless, sensing regions are conventionally formed in silicon by selectively etching the back side of certain areas of a substrate so that the thickness of the substrate in these areas is sufficiently reduced so that the silicon deflects or deforms in response to an applied stress. This selective etching process, however, requires multiple steps that protract the fabrication process. Moreover, the small selectively thinned areas prohibit associated circuitry from being formed close to the sensing regions, where forming associated circuitry close to sensing regions would be desirable because it fosters enhanced performance and allows sensing devices to be more compact.

By way of further example discrete piezoresistive sensing resistors (e.g., metal foil, silicon resistors in a Wheatstone bridge configuration) that are bonded to an engineered mechanical structure, and that have separate signal conditioning electronics mounted in a stress free zone (e.g., ASIC mounted on a separate PCB) can be used for force sensors where the strain gages are mounted on a load cell/beam, or for a pressure sensor where the strain gages are mounted on a metal diaphragm. This configuration has certain disadvantages in terms of packaging size, packaging complexity, and/or cost due to the use of separate strain gage resistors and signal conditioning ASIC. This arrangement does have an advantage, however, of the piezoresistive sensing resistors not coming into contact with the pressure media being sensed; that is, the sensing resistors are sensing the stress transmitted through a diaphragm that is in direct contact with the pressure media.

By way of further example, in piezoresistive sensing resistors that are integrated with signal conditioning electronics on a selectively thinned single silicon substrate, the applied strain can be isolated from the signal conditioning circuitry. In this arrangement the thinned silicon section forms a diaphragm that is in direct contact with the pressure media being sensed. While the integrated strain gage and signal conditioning structure provides desirable packaging size and cost advantages, this type of integrated structure may have applications limited to pressure sensing due to the fact that the design must allow the pressure media to be in direct contact with the silicon.

SUMMARY

One or more aspects of the invention pertain to forming a semiconductor sensing device by etching the entire back side of a semiconductor substrate, rather than selectively etching certain areas of a wafer. Etching the entire substrate streamlines the fabrication process by reducing the number of steps involved, and it also promotes improved performance and a more compact sensing device as it enables associated support circuitry to be formed closer to a sensing region.

An integrated strain gage and signal conditioning design that overcomes limitations of traditional sensor designs is generated in accordance with one or more aspects of the invention. More particularly, an integrated strain gage and signal conditioning structure provides sensor cost and size benefits, and can be used in a wide range of sensors, including both load cells and media isolated pressure sensors. Notably, associated support circuitry (e.g., signal conditioning ASIC) and piezoresistive sensing resistors are integrated onto a uniformly (not selectively) thinned die. The approach allows a flat back side surface to be produced on the wafer (die) so that a mechanical strain sensing structure can be formed therein, while concurrently mitigating structural stiffness so as to not interfere with mechanical sensing. This allows for the use of a strain insensitive signal conditioning architecture.

According to one or more aspects of the invention, a method of forming a semiconductor sensing device is disclosed. The method includes chemically etching the entire back side of a semiconductor substrate so that the substrate flexes in response to an applied stress, and then forming the sensing device within the thinned substrate.

According to one or more further aspects of the invention, a semiconductor wafer is disclosed. The wafer has a back side that has been chemically etched such that the wafer has a thickness of between about 6 mils and about 8 mils. One or more sensing devices are also formed within the thinned semiconductor wafer.

In accordance with yet one or more further aspects of the invention, a semiconductor sensing device is disclosed. The sensing device includes a sensing region formed within a thinned semiconductor substrate and associated support circuitry also formed within the thinned semiconductor substrate in close proximity to the sensing region.

DETAILED DESCRIPTION OF EXAMPLE EMBODIMENTS

Figure 1:
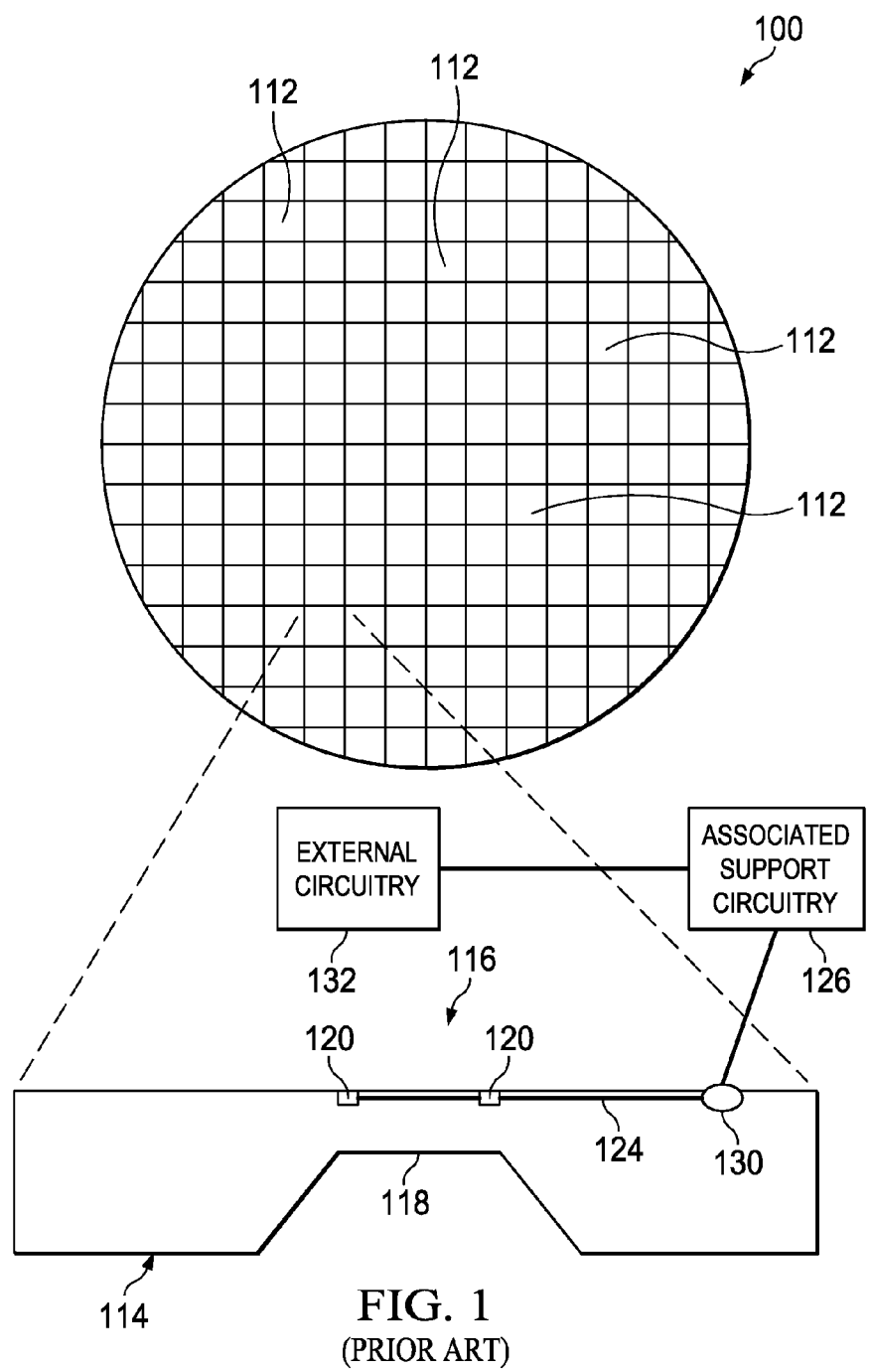
FIG. 1 is a schematic diagram illustrating a semiconductor wafer having a plurality of die thereon and a cross-sectional illustration of an enlargement of a die having a conventional pressure sensor formed thereon.

FIG. 1 is a schematic diagram illustrating a top view of a semiconductor wafer 100 having a plurality of die 112 thereon. Additionally, a cross-sectional view presents an enlarged illustration of an example die 114 of the wafer 100. The die 114 has a conventional pressure sensor 116 formed thereon. In particular, a selective etching process has been performed on the back side of the wafer 100 to remove a portion of the back side of the wafer at the wafer die 114. This selective etching process leaves a portion 118 of the die 114 relatively thin so that it flexes in response to an applied pressure. One or more piezoelectric elements 120 are formed in this thinned region 118 to generate an electrical signal in response to a flexing of the thinned region 118. This signal is delivered via an electrically conductive lead 124 to associated support circuitry 126, which can perform calibration and/or compensation functions, for example. In this conventional arrangement, however, the associated support circuitry 126 is not integral to the die 114. Rather, the die 114 is cut from the wafer 100 and then operatively associated with the support circuitry 126, such as by an electrode or solder bond 130, for example. In the illustrated example, the associated support circuitry 126 is further connected to external circuitry 132 which can use the detected signals for different purposes, such as to determine whether to deploy an airbag, for example.

It can be appreciated, however, that spot etching the back side of each die 112 on the wafer 100 in this conventional manner can be tedious, time consuming and expensive. In particular, the respective regions 118 of the die 114 are generally thinned using lithographic techniques, where lithography generally refers to processes for transferring one or more patterns between various media. In lithography, a radiation sensitive resist coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example. In this case, the patterned mask would be formed over the back side of the wafer 100 with the exposed pattern allowing an etchant to etch away or remove material at the respective regions 118 on the different die 112. In addition to protracting the fabrication process, etching individual die may also (unintentionally) produce sensors that have different operating characteristics. More particularly, since the sensitivity of the sensors is primarily a function of the thickness of the wafer 100 at the thinned regions 118 (e.g., how readily the substrate deflects in response to applied pressure), the individually produced sensors can produce different results since the selective etching processes may thin the respective regions 118 differently. In this manner, different sensors 16 may give different readings in response to the same or a similar applied pressure.

Figure 2:
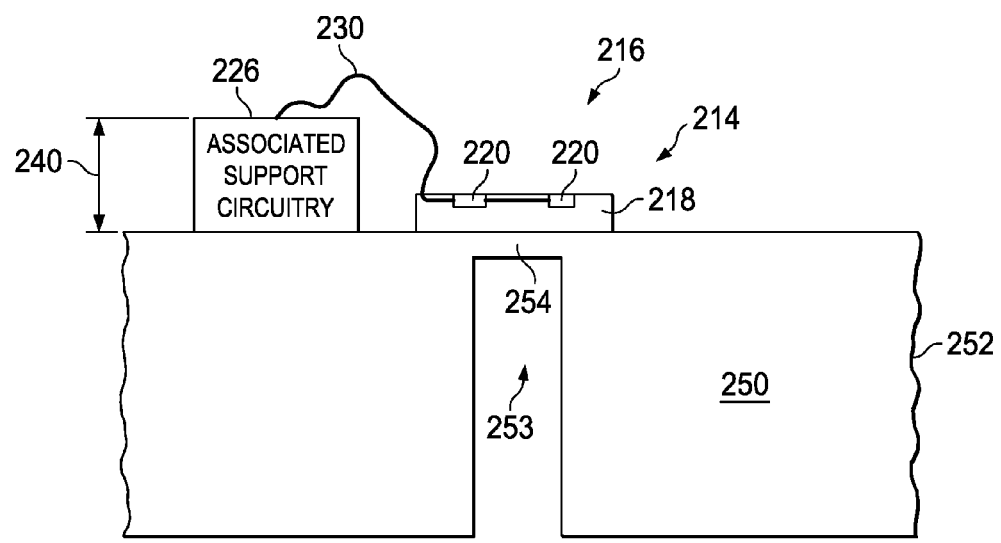
FIG. 2 is a cross-sectional illustration of a conventional pressure sensor associated on a pressure sensor housing.

FIG. 2 is another cross-sectional illustration of a conventional pressure sensor 216. The sensor 216 is seated atop a pressure sensor housing 250 that can be threaded 252 into a system where the pressure is to be sensed, such as within a combustion chamber of an internal combustion engine, for example. The housing 250 has an aperture 253 formed therein that allows a pressure that is to be sensed to be applied against the sensor 216 (e.g., via a mechanical diaphragm 254 of the housing 250). The sensor 216 is formed from a wafer die 214, the back side of which has been selectively etched to produce a thinned region 218. The sensor 200 also has multiple piezoelectric elements 220 formed therein. The elements 220 are operatively coupled to associated support circuitry 226 via one or more bond wires 230. In this conventional arrangement, the support circuitry 226 is again not integral with the wafer die 214. Rather, the support circuitry 226 is formed in the un-thinned 240 substrate. As such, the sensor 216 is not very compact and may not perform optimally as some signal degradation, as well as a time delay, may occur along the bond wire(s), for example.

Figure 3:
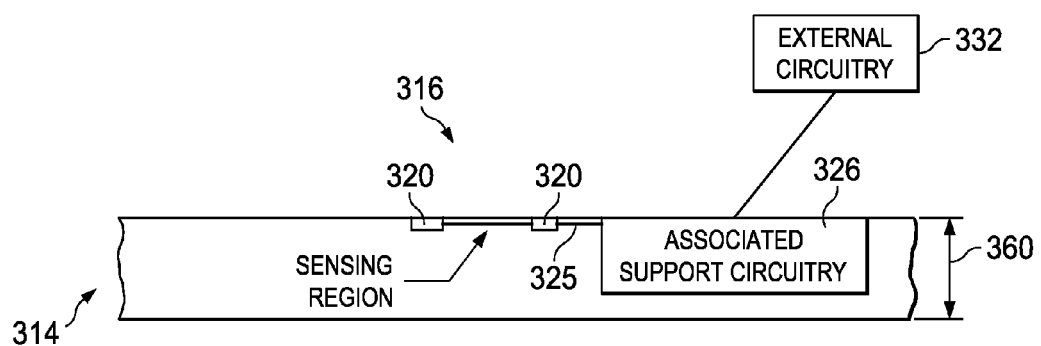
FIG. 3 is a cross-sectional illustration of a semiconductor substrate having a semiconductor sensing device formed thereon in accordance with one or more aspects of the invention.

FIG. 3 is a cross-sectional view illustrating a semiconductor sensing device formed according to one or more aspects of the invention. More particularly, FIG. 3 depicts a semiconductor wafer die 314 that has been cut (e.g., via a metal cutting blade or other mechanical means) from a uniformly thinned semiconductor wafer or substrate, and that has a semiconductor sensing device 316 formed therein. It will be appreciated that for purposes of the invention, the wafer and/or die 314 can include a semiconductor substrate, an epitaxial layer deposited or otherwise formed on a semiconductor substrate and/or any other type of semiconductor body (e.g., silicon, SiGe, SOI).

In forming the device 316 according to one or more aspects of the invention, the entire back side of the wafer from which the die 314 is cut is initially thinned to a thickness 360 of between about 6 mils and about 8 mils, for example. The device 316 includes a sensing region 360 wherein one or more piezoelectric elements 320 are formed, such as via doping and/or diffusion, for example. In addition, associated support circuitry 326 (e.g., ASIC/signal conditioning circuitry) is also formed within the thinned wafer die 314. The associated support circuitry 326 is operatively coupled to the diffusion regions 360, and more particularly to the piezoelectric elements 320, via a conductive trace 325 that is also formed within the die 314. The associated support circuitry 326 is in turn coupled to external circuitry 332. It can be appreciated that having the associated support circuitry 326 in close proximity to the sensing region 360 improves performance (e.g., due to improved eletro-mechanical connections, and a lack of signal degradation and/or timing delay(s)). It will be appreciated that the application of a controlled chemical back etch process according to one or more aspects of the invention yields a thinner wafer and a higher quality of uniform thickness as well as smoothness and structural integrity unattainable in mechanical backgrinding processes. These chemical back etch attributes allow for integration of the piezoelectric element and the support circuitry to be placed on the same substrate. More particularly, the treated substrate is thin enough to allow flexibility for the piezoelectric elements and structurally sound enough to contain the support circuitry. In addition to allowing semiconductor sensors to be made smaller or more compact, integrating the support circuitry 326 also reduces fabrication costs by obviating the need for additional components, such as bond wires and/or solder. Eliminating such components which are susceptible to failure (e.g., bond wire breaking and/or solder joint detaching) also enhances the resilience of such devices 316.

It will be appreciated that the back side of the wafer is uniformly thinned to such a degree that the die 314 deflects or deforms in response to a force applied thereto (e.g., due to pressure, acceleration, deceleration, etc.). Additionally, the piezoelectric elements 320 are generally formed at the outskirts or edges of the portion of the die 314 that deflects (e.g., the sensing region 360) so that they experience a maximum flexing and thus afford the sensing device 316 with an enhanced or optimum sensitivity.

According to one or more aspects of the invention, the wafer, and thus the die 314, can be thinned by a wet etching process. Uniformly etching the entire back side of the wafer has several advantages over conventional ways of reducing its thickness, such as mechanical backgrinding, for example. Nevertheless, some preliminary mechanical backgrinding may (optionally) be performed according to one or more aspects of the invention to partially thin the wafer. For example, a wafer having a thickness of about 30 mils can be preliminarily thinned to about 20 mils by backgrinding. Chemical etching, however, can be controlled to much tighter tolerances than grinding alone, both in overall resultant thickness and in variation of thickness across the entire wafer. This allows more consistent sensors to be fabricated from a more uniformly thinned wafer, and wafer die. Substantial backgrinding can also induce stress fractures in the semiconductor substrate, which can degrade the performance of resulting semiconductor devices. Etched wafer die have also shown improved adhesion characteristics (e.g., for subsequently applied layer(s), element(s), etc.). Finally, etching the entire wafer streamlines the fabrication process by eliminating several steps that would otherwise be needed to spot etch the wafer die 314.

Figure 4:
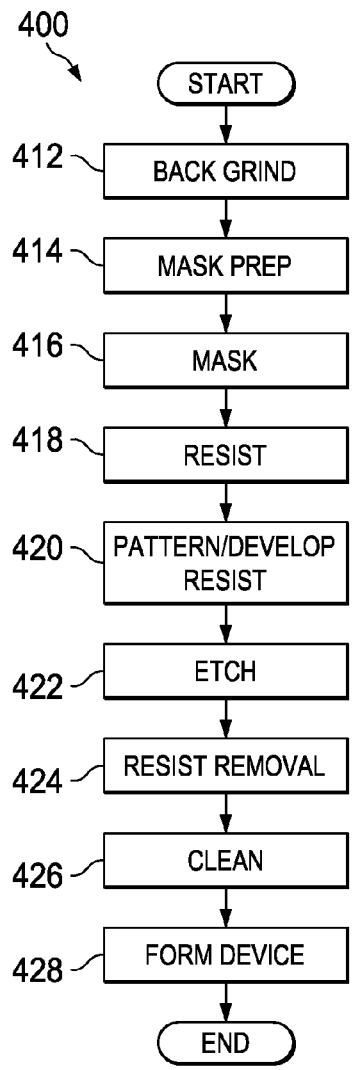
FIG. 4 is a flow diagram illustrating a conventional methodology for forming a semiconductor sensing device.

Turning to FIG. 4, for example, a methodology 400 is illustrated for spot etching a wafer in a conventional manner. Initially, the back side of the wafer is ground down by mechanical means at 412. A mask prep step is then performed at 414 wherein the back side of the wafer is cleaned (e.g., washed and dried). Then, at 416 a masking step is performed wherein an intervening mask is positioned between a radiation source and the back side of the wafer where the mask itself has to be fashioned beforehand to correspond to a pattern to be transferred onto the wafer. A layer of radiation sensitive masking material (e.g., a resist) is then formed over the back side of the wafer at 418. The layer of masking material is then patterned and developed at 420 by shining radiation thereon that selectively passes through the intervening mask or template and then applying a developer (e.g., an acid wash) that removes the portions of the masking material made soluble by the selective radiation exposure. Portions of the back side of the wafer are then removed via an etching process at 422, where the patterned layer of masking material serves as a mask for the etching process. The patterned layer of masking material is then stripped or otherwise removed (e.g., via an acid wash) at 424. The back side of the wafer is then subjected to a final clean-up step at 426 before a semiconductor sensor can be formed on a wafer die at 428.

Figure 5:
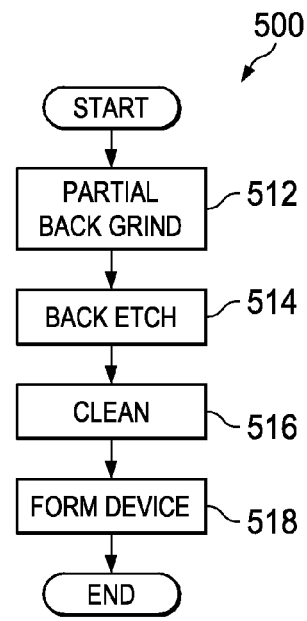
FIG. 5 is a flow diagram illustrating an example methodology for forming a semiconductor sensing device according to one or more aspects of the invention.

An example methodology 500 of forming a semiconductor sensor on a wafer die according to one or more aspects of the invention is on the other hand illustrated in the flow diagram of FIG. 5. It will be appreciated that although the methodology 500 is illustrated and described hereinafter as a series of acts or events, the invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the invention. Further, one or more of the acts may be carried out in one or more separate acts or phases. It will be appreciated that a methodology carried out according to one or more aspects of the invention may be implemented in association with the formation and/or processing of structures illustrated and described herein as well as in association with other structures not illustrated or described herein.

The methodology 500 begins at 512 wherein an optional back grinding of the back side of a wafer is performed to reduce the thickness of the wafer to about 20 mils. Then, at 514 the back side of the wafer is uniformly etched with a wet etch chemistry so that the wafer is reduced to thickness of between about 6 mils and about 8 mils, for example. The thinned wafer is then cleaned at 516 and a semiconductor sensor is formed on a wafer die at 518. It will be appreciated that the die can be removed from the wafer in any suitable manner, such as by being cut with traditional mechanical means so as to not complicate the fabrication process.

It can thus be appreciated that forming a semiconductor sensor as described herein where the back side of a wafer is initially etched to a reduced uniform thickness streamlines the fabrication process, thereby reducing costs associated with producing the sensor. Additionally, sensors produced in manners described herein have improved reliability and can be made more compact as compared to conventionally produced sensors. Less expensive sensors can translate into huge savings since many sensors can be used in the automotive industry alone. For example, (conservatively) assume that there are 50 million vehicles (e.g., cars, trucks, busses, etc.) wherein such sensors can be used, and that each vehicle can include one sensor in its chassis, five occupant (weight) sensors and five engine (pressure) sensors. This would put sensor demand at 550 million sensors—50 million for the chassis, 250 million for occupants and 250 million for the engine. Even more conservatively assuming a 50% participation for the chassis, a 20% participation for the occupants and a 20% participation for the engine, there still remains a demand for 125 million sensors (annually)—25 million for the chassis, 50 million for the occupants and 50 million for the engine. It can be appreciated that saving just a little per sensor can lead to extraordinary overall savings.

Although one or more aspects of the invention have been shown and described with respect to one or more example implementations, equivalent alterations and modifications will occur to others skilled in the art based upon a reading and understanding of this specification and the annexed drawings. The invention includes all such modifications and alterations and is limited only by the scope of the claims.

What is claimed is:

1. A semiconductor device, comprising:
a uniformly thin semiconductor substrate die capable of flexing, when supported, in response to a force applied thereto;
one or more piezoelectric elements formed integrally within the die for generating electrical signals in response to the flexing of the die;
support circuitry formed integrally within the die in proximate association with the one or more piezoelectric elements; and
conductive leads formed integrally within the die for electrically communicating the generated electrical signals from the one or more piezoelectric elements to the support circuitry.

2. The device of claim 1, wherein the die has a thickness of between about 6 mils and about 8 mils.

3. The device of claim 1, wherein the uniformly thin die comprises a die cut from a wafer whose thickness has been reduced by chemically etching an entire back side of the wafer.

4. The device of claim 3, wherein the back side has been etched with a wet etch.

5. The device of claim 1, further comprising a housing; the die being mounted within the housing.

6. The device of claim 5, wherein the semiconductor device comprises a Pressure sensor; the die is supported within the housing for flexing in response to changes in pressure; and the support circuitry comprises signal conditioning circuitry for conditioning the electrical signals communicated from the one or more piezoelectric elements.

7. The device of claim 1, wherein the one or more piezoelectric elements are piezoresistive elements arranged in Wheatstone bridge configuration.

8. A semiconductor device, comprising:
a semiconductor substrate die of uniform thickness, thinned from a starting wafer thickness by chemically etching a back side; the die capable of flexing, when supported, in response to an applied stress;
one or more piezoelectric elements formed integrally within a sensing region of the die for generating electrical signals in response the flexing of the die;
support circuitry formed integrally within the die in close proximity to the sensing region; and
conductive leads formed integrally within the die for electrically communicating the generated electrical signals from the one or more piezoelectric elements to the support circuitry without the use of a bond wire.

9. The device of claim 8, wherein the one or more piezoelectric elements are piezoresistive elements arranged in Wheatstone bridge configuration.

10. The device of claim 9, wherein the device is a pressure sensor.

11. The device of claim 10, further comprising a threaded housing; the die being supported for flexing in the threaded housing.

12. A semiconductor pressure sensing device, comprising:
a die cut from a wafer thinned by back side chemical etching to a uniform thickness of between about 6 mils and about 8 mils; the die capable of flexing, when supported, in response to a force applied thereto;
one or more piezoresistive elements in the form of silicon resistors formed integrally via doping and diffusion in Wheatstone bridge configuration within a sensing region of the die; the one or more piezoelectric elements generating electrical signals in response to the flexing of the die;
support circuitry formed outside the sensing region integrally within the die;
conductive leads formed integrally within the die for electrically communicating the generated electrical signals from the one or more piezoelectric elements to the support circuitry; and
a sensor housing having an aperture; the die being seated to serve as a deformable diaphragm atop the aperture of the sensor housing;
whereby deformation of the seated die in response to changes in pressure will cause changes in resistance of the piezoresistive elements to produce corresponding signals communicated by the conductive leads and processed by the support circuitry.

* * * * *